(12) United States Patent
Powell et al.

(10) Patent No.: US 7,314,520 B2
(45) Date of Patent: *Jan. 1, 2008

(54) LOW 1C SCREW DISLOCATION 3 INCH SILICON CARBIDE WAFER

(75) Inventors: Adrian Powell, Apex, NC (US); Mark Brady, Carrboro, NC (US); Stephen G. Mueller, Durham, NC (US); Valeri F. Tsvetkov, Durham, NC (US); Robert T. Leonard, Raleigh, NC (US)

(73) Assignee: Cree, Inc., Durham, NC (US)

( * ) Notice: Subject to any disclaimer, the term of this patent is extended or adjusted under 35 U.S.C. 154(b) by 232 days.

This patent is subject to a terminal disclaimer.

(21) Appl. No.: 10/957,806

(22) Filed: Oct. 4, 2004

(65) Prior Publication Data

US 2006/0073707 A1  Apr. 6, 2006

(51) Int. Cl.
*C30B 25/12* (2006.01)
(52) U.S. Cl. .................... 117/109; 438/745
(58) Field of Classification Search .............. 117/84, 117/109; 438/745
See application file for complete search history.

(56) References Cited

U.S. PATENT DOCUMENTS

| | | | |
|---|---|---|---|
| 4,387,503 A | 6/1983 | Aswell et al. | |
| 4,543,594 A | 9/1985 | Mohsen et al. | |
| 4,605,872 A | 8/1986 | Rung | |
| 4,777,471 A | 10/1988 | Comer | |
| 4,779,126 A | 10/1988 | Herman | |
| 4,799,126 A | 1/1989 | Kruse et al. | |
| 4,860,185 A | 8/1989 | Brewer et al. | |
| 4,885,477 A | 12/1989 | Bird et al. | |
| 4,894,791 A | 1/1990 | Jiang et al. | |
| 4,910,508 A | 3/1990 | Yamazaki | |
| 5,021,861 A | 6/1991 | Baliga | |
| RE34,861 E | 2/1995 | Davis et al. | |
| 5,539,217 A | 7/1996 | Edmond et al. | |
| 5,663,580 A | 9/1997 | Harris et al. | |
| 5,883,403 A | 3/1999 | Ishikawa et al. | |
| 5,929,482 A | 7/1999 | Kawakami et al. | |
| 5,958,132 A | 9/1999 | Takahashi et al. | |
| 6,657,276 B1 | 12/2003 | Karlsson et al. | |
| 6,754,104 B2 | 6/2004 | King | |
| 2002/0038627 A1 | 4/2002 | Vodakov et al. | |
| 2003/0070611 A1 | 4/2003 | Nakamura et al. | |

(Continued)

FOREIGN PATENT DOCUMENTS

EP  1 143 033 A  10/2001

(Continued)

OTHER PUBLICATIONS

Roland Madar; Materials science: Silicon carbide in contention; Nature; Aug. 26, 2004; vol. 430, pp. 974-975.

(Continued)

*Primary Examiner*—Felisa Hiteshew
(74) *Attorney, Agent, or Firm*—Summa, Allan & Additon, P.A.

(57) ABSTRACT

A high quality single crystal wafer of SiC is disclosed having a diameter of at least about 3 inches and a 1 c screw dislocation density of less than about 2000 $cm^{-2}$.

35 Claims, 3 Drawing Sheets

U.S. PATENT DOCUMENTS

2005/0022724 A1  2/2005  Malta et al.
2005/0022727 A1  2/2005  Fechko et al.

FOREIGN PATENT DOCUMENTS

WO  WO 01/68954 A  9/2001

OTHER PUBLICATIONS

Daisuke Nakamura et al.; Ultrahigh-quality silicon carbide single crystals; Nature; Aug. 26, 2004; vol. 430, pp. 1009-1012.

Edward K. Sanchez et al.; Formation of Thermal Decomposition Cavities in Physical Vapor Transport of Silicon Carbide; Journal of Electronic Materials; vol. 29, No. 3 (2000); pp. 347-352.

Adrian Powell et al.; Growth of Low Micropipe Density SIC Wafers; Materials Science Forum; vols. 338-342 (2000); pp. 437-440.

Thomas A. Kuhr et al.; Hexagonal voids and the formation of micropipes during SiC sublimation growth; Journal of Applied Physics; Apr. 15, 2001; vol. 89, No. 8; pp. 4625-4630.

Wang S. et al, "Growth of 3-inch diameter 6H-SiC single crystals by sublimination physical vapor transport," Materials Science Forum Trans Tech Publications Switzerland, vol. 389-393, 2002, pp. 35-38.

Yoganthan M. et al, "Growth of large diameter semi-insulating 6H-SiC crystals by physical vapor transport." Silicon Carbide 2004—Materials, Processing and Devices (Materials Research Society Symposium Proceedings vol. 815) Materials Research Soc. Warrendale, PA, USA, 2004, pp. 21-26.

Muller St G et al, "Defects in SiC substrates and epitaxial layers affecting semiconductor device performance," European Physical Journal, Applied Physics EDP Sciences France, vol. 27, No. 1-3, Jul. 2004, pp. 29-35.

LOW 1C SCREW DISLOCATION 3 INCH SILICON CARBIDE WAFER

STATEMENT OF GOVERNMENT INTEREST

This invention was developed under Office of Naval Research/DARPA Contract No. N00014-02-C-0306. The government may have certain rights in this invention.

BACKGROUND OF THE INVENTION

The present invention relates to low defect silicon carbide wafers and their use as precursors for semiconductor purposes, and to seeded sublimation growth of large, high-quality silicon carbide single crystals.

Silicon carbide has found use as semiconductor material for various electronic devices and purposes in recent years. Silicon carbide is especially useful due to its physical strength and high resistance to chemical attack. Silicon carbide also has excellent electronic properties, including radiation hardness, high breakdown field, a relatively wide band gap, high saturated electron drift velocity, high-temperature operation, and absorption and emission of high-energy photons in the blue, violet, and ultraviolet regions of the spectrum.

Single crystal silicon carbide is often produced by a seeded sublimation growth process. In a typical silicon carbide growth technique, the seed crystal and a source powder are both placed in a reaction crucible which is heated to the sublimation temperature of the source and in a manner that produces a thermal gradient between the source and the marginally cooler seed crystal. The thermal gradient encourages vapor phase movement of the materials from the source to the seed followed by condensation upon the seed and the resulting bulk crystal growth. The method is also referred to as physical vapor transport (PVT).

In a typical silicon carbide growth technique, the crucible is made of graphite and is heated by induction or resistance, with the relevant coils and insulation being placed to establish and control the desired thermal gradient. The source powder is silicon carbide, as is the seed. The crucible is oriented vertically, with the source powder in the lower portions and the seed positioned at the top, typically on the seed holder; see U.S. Pat. No. 4,866,005 (reissued as No. Re34,861) the contents of which are incorporated entirely herein by reference. These sources are exemplary, rather than limiting, descriptions of modern seeded sublimation growth techniques.

The invention is also related to the following copending and commonly assigned U.S. applications: Ser. No. 10/628,189 filed Jul. 28, 2003 for Growth of Ultra-High Purity Silicon Carbide Crystals in an Ambient Containing Hydrogen; Ser. No. 10/628,188 filed Jul. 28, 2003 for Reducing Nitrogen Content in Silicon Carbide Crystals by Sublimation Growth in a Hydrogen-Containing Ambient; Ser. No. 10/707,898 filed Jan. 22, 2004 for Silicon Carbide on Diamond Substrates and Related Devices and Methods; Ser. No. 60/522,326 filed Sep. 15, 2004 for Seed Preparation for the Growth of High Quality Large Size Silicon Carbide Crystals; Ser. No. 10/915,095 filed Aug. 10, 2004 for Seed and Seedholder Combinations for High Quality Growth of Large Silicon Carbide Single Crystals; and Ser. No. 10/876,963 filed Jun. 25, 2004 for One Hundred Millimeter High Purity Semi-Insulating Single Crystal Silicon Carbide Wafer. The contents of these applications are likewise incorporated entirely herein by reference.

Although the density of structural defects in silicon carbide bulk crystals has been continually reduced in recent years, relatively high defect concentrations still appear and have been found to be difficult to eliminate, e.g. Nakamura et al., "Ultrahigh quality silicon carbide single crystals," Nature, Vol. 430, Aug. 26, 2004, page 1009. These defects can cause significant problems in limiting the performance characteristics of devices made on the substrates, or in some cases can preclude useful devices altogether. Current seeded sublimation techniques for the production of large bulk single crystals of silicon carbide typically result in a higher than desired concentration of defects on the growing surface of the silicon carbide crystal. Higher concentrations of defects can cause significant problems in limiting the performance characteristics of devices made on the crystals, or substrates resulting from the crystals. For example, a typical micropipe defect density in some commercially available silicon carbide wafers can be on the order of 100 per square centimeter ($cm^{-2}$). A megawatt device formed in silicon carbide, however, requires a defect free area on the order of 0.4 $cm^{-2}$. Thus, increasing the quality of large single crystals that can be used to fabricate large surface area devices for high-voltage, high current applications remains a worthwhile goal.

Although small samples of low-defect silicon carbide have been available, a broader commercial use of silicon carbide requires larger samples, and in particular, larger wafers. By way of comparison, 100 mm (4") silicon wafers have been commercially available since 1975 and 150 mm (6") silicon wafers became available in 1981. Gallium arsenide (GaAs) is also commercially available in both 4" and 6" wafers. Thus, the commercial availability of 50 mm (2") and 75 mm (3") SiC wafers lags behind these other materials and to some extent limits the adoption and use of SiC in a wider range of devices and applications.

Screw dislocations, particularly 1 c screw dislocations, are common defects that develop or propagate during the production of SiC crystals. Other surface defects include threading dislocations, hexagonal voids, and micropipes. If these defects remain in the SiC crystal, then resulting devices grown on the crystal may incorporate these defects.

The nature and description of specific defects is generally well understood in the crystal growth art. In particular, a screw dislocation is defined as one in which the Burgers Vector is parallel to the direction vector. On an atomic scale, the resulting dislocation gives the general appearance of a spiral staircase. The presence of a large number of screw dislocations can also lead to the presence of other defects, such as micropipes and hexagonal voids.

A micropipe is a hollow core super-screw dislocation with its Burgers vector lying along the c-axis. Micropipes are often formed from a grouping of 3 or more screw dislocations. A number of causes have been proposed or identified for the generation of micropipes. These include excess materials such as silicon or carbon inclusions, extrinsic impurities such as metal deposits, boundary defects, and the movement or slippage of partial dislocations. See e.g. Powell et al., Growth of Low Micropipe Density SiC Wafers, Materials Science Forum, Vols. 338-340, pp 437-440 (2000).

Hexagonal voids are flat, hexagonal platelet-shaped cavities in the crystal that often have hollow tubes trailing beneath them. Some evidence shows that micropipes are associated with hexagonal voids. A relatively recent discussion of such defects (exemplary and not limiting) is set forth in Kuhr et al., Hexagonal Voids And The Formation Of Micropipes During SiC Sublimation Growth, Journal of Applied Physics, Volume 89, No. 8, page 4625 (April 2001).

The presence of surface defects in bulk single crystals of SiC may also interfere with single-polytype crystal growth. The 150 available polytypes of SiC raise a particular difficulty. Many of these polytypes are very similar, often separated only by small thermodynamic differences. Maintaining the desired polytype identity throughout the crystal is only one difficulty in growing SiC crystals of large sizes in a seeded sublimation system. When surface defects are present, there is not enough polytype information on the crystal surface for depositing layers to maintain the desired polytype. Polytype changes on the surface of the growing crystal result in the formation of even more surface defects.

Recent research indicates that problems in the bulk crystals produced in a seeded sublimation technique can originate with the seed itself and the manner in which it is physically handled; e.g., Sanchez et al Formation Of Thermal Decomposition Cavities In Physical Vapor Transport Of Silicon Carbide, Journal of Electronic Materials, Volume 29, No. 3, page 347 (2000). Sanchez uses the term "micropipe" to describe, "approximately cylindrical voids with diameters in the range of 0.1 μm to 5 μm that form at the core of superscrew dislocations aligned parallel or nearly parallel to the [0001] axis" Id. at 347. Sanchez refers to larger voids ("diameters from 5 μm to 100 μm") as, "thermal decomposition cavities," and opines that micropipes and thermal decomposition cavities arise from different causes. Id.

Accordingly, producing larger high quality bulk single crystals of silicon carbide with low 1 c screw dislocation defect levels in crystals formed in the seeded sublimation system, in order to reduce the total number of defects in the produced crystals remains a constant technical and commercial goal.

SUMMARY

In one aspect, the present invention is a high quality single crystal wafer of SiC having a diameter of at least about 3 inches and a 1 c screw dislocation density of less than about 2000 $cm^{-2}$.

In another aspect, the invention is a SiC semiconductor precursor wafer having a diameter of at least about 3 inches and a 1 c screw dislocation density of less than about 2500 $cm^{-2}$.

In another aspect, the invention is a method of using a high quality single crystal wafer of SiC having a diameter of at least about 3 inches and a 1 c screw dislocation density of less than about 2500 $cm^{-2}$ in a seeded sublimation growth system.

In yet another aspect, the invention is power devices built on a single crystal seed of SiC having a diameter of at least about 3 inches and a 1 c screw dislocation density of less than about 2500 $cm^{-2}$.

DETAILED DESCRIPTION

The present invention relates to high quality silicon carbide wafers. In particular, the present invention incorporates several techniques for improving the growth of such wafers using seeded sublimation.

In one aspect, the present invention is a high quality single crystal wafer of SiC having a diameter of at least about 3 inches and a 1 c screw dislocation density less than about 2000 $cm^{-2}$, more preferably less than about 1500 $cm^{-2}$, and most preferably less than about 1000 $cm^{-2}$. The polytype of the single crystal SiC is preferably 3C, 4H, 6H, or 15R.

In considering the proportional dimensions of the diameter and thickness of the seed crystal, whether expressed as a percentage, a fraction, or a ratio, it will be understood that in the context of the improvements provided by the invention, these proportions have their inventive meaning in the context of the larger-diameter seed crystals that are described herein.

Accordingly, in certain embodiments the invention is described and claimed herein in the relevant embodiments in a manner that includes the absolute dimensions of the crystal, usually in terms of a diameter, of which 2 inch, 3 inch, and 100 mm diameter single crystals are preferred.

Figure 1:
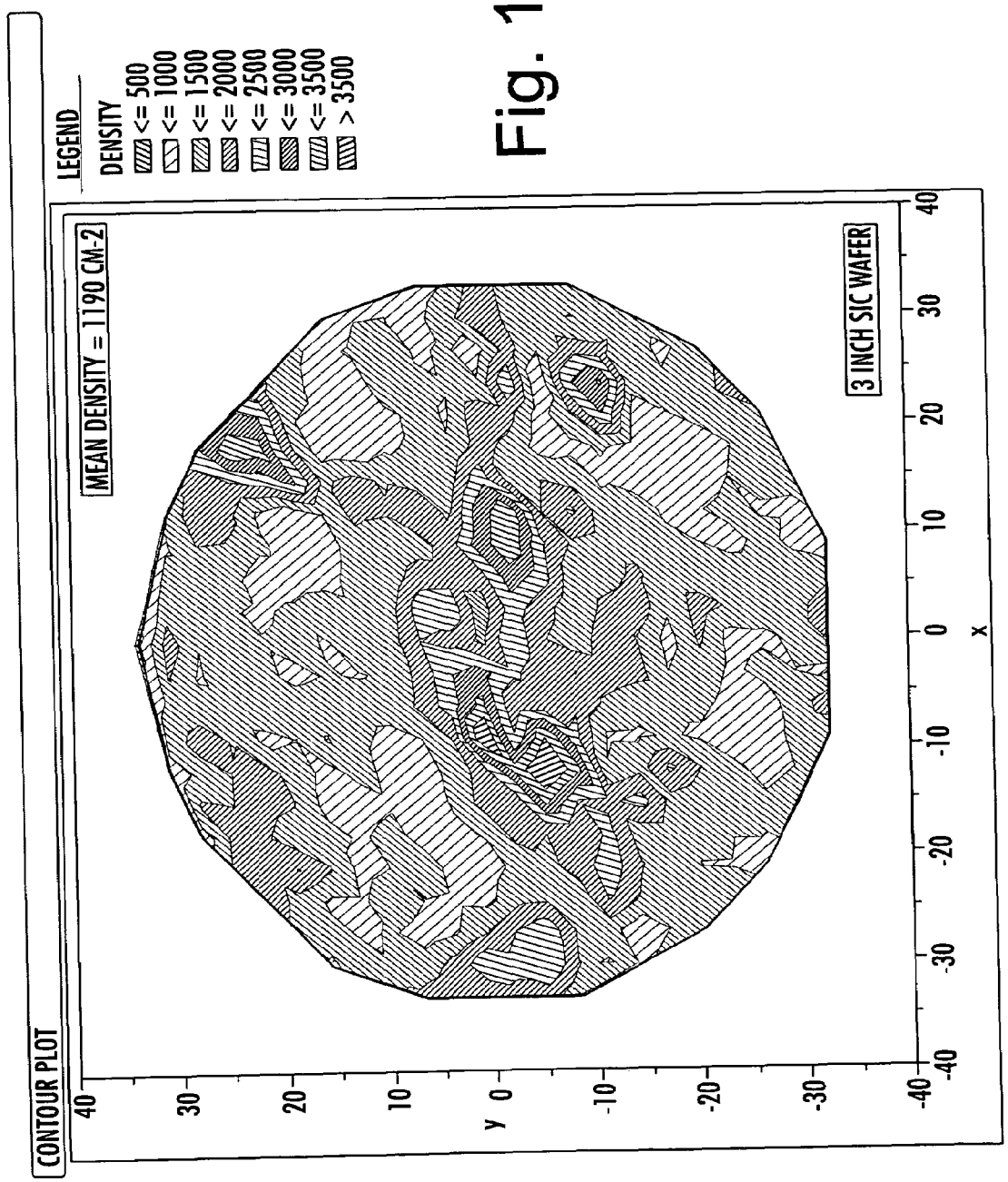
FIG. 1 is a map of a SiC wafer after defect etching in accordance with the present invention.

FIG. 1 is a map of a wafer 2 in accordance with the present invention. When appropriately counted, the average 1 c screw dislocation density of the wafer was 1190 $cm^{-2}$. As indicated by FIG. 1, measurable areas of crystals according to the present invention exhibit defect densities of less than 1000 $cm^{-2}$ and in some cases less than 500 $cm^{-2}$. Thus, as used herein the expression "less than" has both measured and predictive aspects. In addition to the measured aspects illustrated in FIG. 1, it is expected that some crystals will demonstrate even fewer defects. As a result, the phrase, "less than" as used herein also includes (but is not limited too) ranges such as 500-2500 $cm^{-2}$.

In another aspect, the invention is a high quality semiconductor precursor wafer. The wafer is a silicon carbide wafer of the 4H polytype, having a diameter of at least about 3 inches and a 1 c screw dislocation density on its surface of less than 2500 $cm^{-2}$. The count of total 1 c screw dislocations represents a count of total 1 c screw dislocations on the surface after an etch that preferentially emphasizes screw dislocation defects. The etch is preferably a molten potassium hydroxide etch.

In yet another aspect, the invention is a high quality semiconductor precursor wafer of silicon carbide having a 4H polytype, a diameter of at least about 3 inches, and less than 123,700 1 c screw dislocations on the surface of the wafer. Again, the surface 1 c screw dislocations represent a count after the molten potassium hydroxide etch.

Figure 2:
FIG. 2 is a semiconductor precursor wafer in accordance with the present invention.

In another aspect as schematically depicted in FIG. 2, the invention is a high quality silicon carbide semiconductor precursor wafer 4 having a 4H polytype, a diameter of at least about 3 inches, and a 1 c screw dislocation density on its surface of less than 2500 cm−2. The wafer additionally has a Group III-nitride layer 6 located on the surface. The Group III-nitride layer 6 is preferably one or more of GaN, AlGaN, AlN, AlInGaN, InN, and AlInN.

The growth and electronic characteristics of Group III nitrides are generally well-understood in this art. Group III nitride layers on silicon carbide substrates are a basic feature of certain types of light emitting diodes (LEDs). Among other desirable factors, the atonic fraction of the Group III element (e.g. $1n_xGa_yN_{1-x-y}$) tailors the bandgap of the composition (within limits) to likewise tailor the resulting emission frequency and thus the color of the LED.

Figure 3:
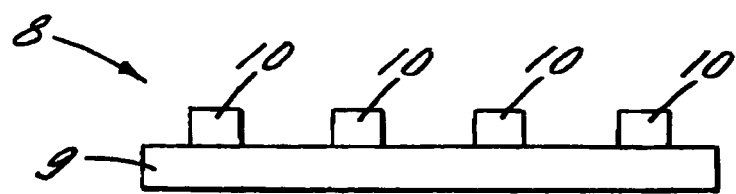
FIG. 3 is a plurality of semiconductor precursor devices in accordance with the present invention.

With respect to FIG. 3, the invention is a plurality of silicon carbide semiconductor device precursors 8 on a SiC seed 9 having a diameter of at least about 3 inches and a 1 c screw dislocation density on the surface of the wafer of less than 2500 cm−2. The wafer additionally has a plurality of respective Group III-nitride epitaxial layers 10 on some portions of the wafer. Preferred Group III-nitride epitaxial layers are individually selected from GaN, AlGaN, AlN, AlInGaN, InN, and AlInN.

In another aspect, the invention is a method of producing a high quality bulk single crystal of silicon carbide in a seeded sublimation system, the improvement includes growing a SiC boule having a diameter of at least about 3 inches and having a 1 c screw dislocation density of less than about 2500 cm$^{-2}$, thereafter slicing the SiC boule, preferably mechanically, into wafers, wherein each wafer has a 1 c screw dislocation density of less than about 2500 cm$^{-2}$ on the surface. The wafers are preferably about 0.5 mm thick.

It may be preferable to then polish and etch the SiC wafers. A preferred polish is a chemo-mechanical polish and a preferred etch is a molten KOH etch. The etch is carried out in order to highlight the defects on the surface, and is unnecessary as a precursor step to seeded sublimation. Thus, sublimation growth is typically carried out on a polished seed that has not been etched.

As is known in the art, the SiC boule is preferably grown in a seeded sublimation system. After the boule is sliced into wafers, the wafers may then, in turn, be used as the seed in a seeded sublimation growth of a single crystal of silicon carbide.

As noted in the background portion of the specification, the general aspects of seeded sublimation growth of silicon carbide have been generally well established for a number of years. Furthermore, those familiar with the growth of crystals, particularly in difficult material systems such as silicon carbide, will recognize that the details of a given technique can and will vary, usually purposefully, depending upon the relevant circumstances. Accordingly, the descriptions given herein are most appropriately given in a general and schematic sense with the recognition that those persons of skill in this art will be able to carry out the improvements of the invention based on the disclosures herein without undue experimentation.

In describing the invention, it will be understood that a number of techniques are disclosed. Each of these has individual benefit, and each can also be used in conjunction with one or more, or in some cases all, of the other disclosed techniques. Accordingly, for the sake of clarity, this description will refrain from repeating every possible combination of the individual steps in an unnecessary fashion. Nevertheless, the specification and claims should be read with the understanding that such combinations are entirely within the scope of the invention and the claims.

Figure 4:
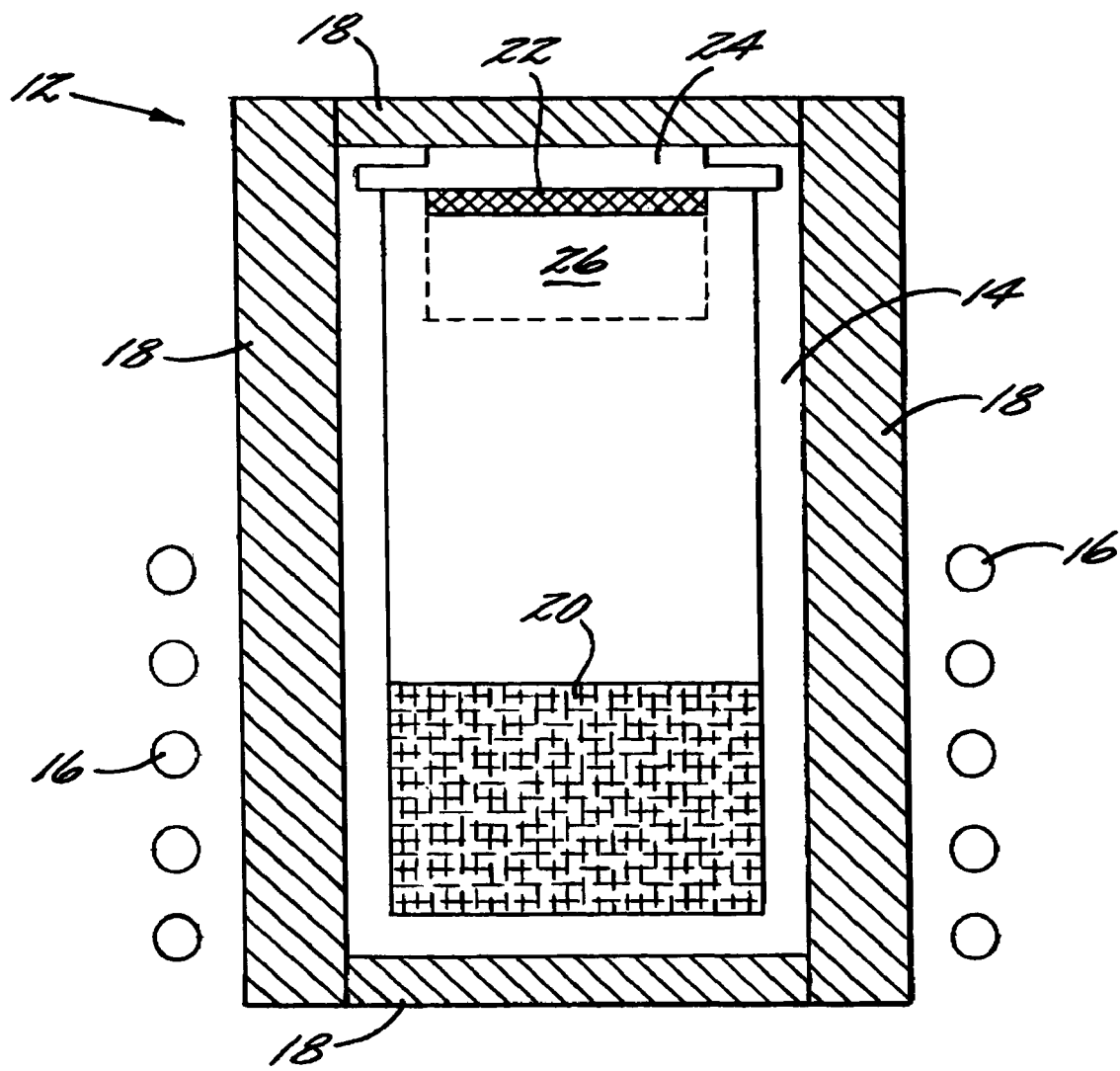
FIG. 4 is a schematic cross-sectional view of a seeded sublimation system in accordance with the present invention.

FIG. 4 is a cross sectional schematic diagram of a sublimation system for seeded sublimation growth of the type contemplated as useful in the present invention. The system is broadly designated at 12. As in most typical systems, the system 12 includes a graphite susceptor, or crucible, 14 and a plurality of induction coils 16 that heat the susceptor 14 when current is applied through the coils 16. Alternatively, some systems incorporate resistance heating. It will be understood by those familiar with these crystal growth techniques that the system can be further enclosed in some circumstances, e.g., in a water-cooled vessel. Additionally, at least one gas inlet and outlet (not shown) in communication with the susceptor 14 are included in the seeded sublimation system 12. Such further enclosures are, however, less relevant to the invention and are omitted herein to help clarify the drawing and description. Additionally, those persons skilled in this art recognize that silicon carbide sublimation systems of the type described herein are available both commercially and as constructed in a custom fashion as may be necessary or appropriate. They accordingly can be selected or designed by those of ordinary skill in this art without undue experimentation.

The susceptor 14 is typically surrounded by insulation 18, several portions of which are illustrated in FIG. 4. Although FIG. 4 illustrates the insulation as being generally consistent in size and placement, it will be understood and is recognized by those of skill in the art that the placement and amount of the insulation 18 can be used to provide desired thermal gradients (both axially and radially) along the susceptor 14. Again, for purposes of simplification, these possible permutations are not illustrated herein.

The susceptor 14 includes one or more portions for containing a silicon carbide powder source 20. Such a powder source 20 is most commonly—although not exclusively—used in seeded sublimation growth techniques for silicon carbide. FIG. 4 illustrates the powder source 20 as being contained in a lower portion of the susceptor 14 and this is one typical arrangement. As another familiar variation, some systems distribute the source powder in a vertical, cylindrical arrangement in which the source powder surrounds a larger portion of the interior of the susceptor 14 than does the arrangement illustrated in FIG. 4. The invention described herein can be appropriately carried out using both types of equipment.

A silicon carbide seed is designated at 22, and is typically placed in upper portions of the susceptor 14. The seed 22 is preferably a monocrystalline SiC seed having a diameter of at least about 75 mm and having a micropipe density of less than about 25 cm$^{-2}$ on the surface. A growing crystal 26 is deposited on the seed 22 during the seeded sublimation growth.

A seed holder 28 typically holds the seed 22 in place with the seed holder 28 being attached to the susceptor 14 in an appropriate fashion. This can include various resting or threaded arrangements. In the orientation illustrated in FIG. 4, the upper portions of the seed holder 28 would typically include threads as would the uppermost portions of the susceptor 14, preferably a graphite crucible, so that the seed holder 28 could be threaded into the top of the susceptor 14 to hold the seed 22 in the desired position. The seed holder 28 is preferably a graphite seed holder.

It may be preferable to place the seed 22 in the crucible 14 while exerting minimal torsional forces on the seed 22 to thereby prevent torsional forces from warping or bowing the crystal in a manner that would otherwise encourage undesired thermal differences across the seed 22.

In some embodiments it may be desirable to anneal the seed holder 28 prior to attaching the seed 22. Annealing the seed holder 28 prior to sublimation growth prevents the seed holder 28 from undergoing significant distortion during crystal growth at SiC sublimation temperatures. Annealing the seed holder 28 also minimizes or eliminates temperature differences across the seed 22 that would otherwise tend to initiate and propagate defects in a growing crystal. A preferred process for annealing the seed holder 28 includes annealing at temperatures at or about 2500° C. for at least about 30 minutes.

In some embodiments, it may be preferred to include dopant atoms in the sublimation system 12. Introducing dopant gases to the seeded sublimation system 12 incorporates dopant atoms in a growing crystal. Dopants are selected for their acceptor or donor capabilities. Donor dopants are those with n-type conductivity and acceptor dopants are those with p-type conductivity. Preferred dopant atoms include n-type and p-type dopant atoms. Especially preferred n-type dopants include N, P, As, Sb, Bi, and mixtures thereof. Especially preferred p-type dopants include B, Al, Ga, In, Tl, and mixtures thereof.

The general scheme for sublimation growth is set forth briefly in the Background portion of the specification, as well as in other sources well-known to those of ordinary skill in this art. Typically, an electric current, having a frequency to which the susceptor 14 responds, is passed through the induction coils 16 to heat the graphite susceptor 14. The amount and placement of the insulation 18 are selected to create a thermal gradient between the powder source 20 and the growing crystal 26 when the susceptor 14 heats the powder source 20 to sublimation temperatures, which are typically above about 2000° C. The thermal gradient is established to maintain the temperature of the seed 22 and thereafter a growing crystal near, but below, the temperature of the silicon carbide source to thereby thermodynamically encourage the vaporized species that are generated when silicon carbide sublimes (Si, $Si_2C$, and $SiC_2$) to condense first upon the seed crystal and thereafter upon the growing crystal; e.g., U.S. Pat. No. 4,866,005.

After reaching the desired crystal size, growth is terminated by reducing the temperature of the system to below about 1900° C. and raising the pressure to above about 400 torr.

It may be further desirable to anneal the crystal after completion of the sublimation growth process. The crystal may be annealed at temperatures at or above the growth temperature for a period typically of about 30 minutes.

For purposes of clarity, the singular term, "thermal gradient," will be used herein, but it will be understood by those of skill in this art that several gradients can desirably co-exist in the susceptor 14 and can be subcategorized as axial and radial gradients, or as a plurality of isotherms.

If the temperature gradients and other conditions (pressure, carrier gases, etc.) are properly maintained, the overall thermodynamics will encourage the vaporized species to condense first on the seed 22 and then on the growing crystal 26 in the same polytype as the seed 22.

As generally noted in the Background, the performance properties of electronic devices will typically improve as the crystal quality of the various device portions improves. Thus, the reduced-defect characteristics of wafers of the present invention similarly provide improved devices. Thus, in another aspect, the invention is a plurality of field-effect transistors formed on low-defect 3 inch silicon carbide wafers. Each field-effect transistor includes a bulk single crystal silicon carbide substrate wafer of at least about 3 inches diameter and having a 1 c screw dislocation density of less than 2500 $cm^{-2}$.

Figure 5:
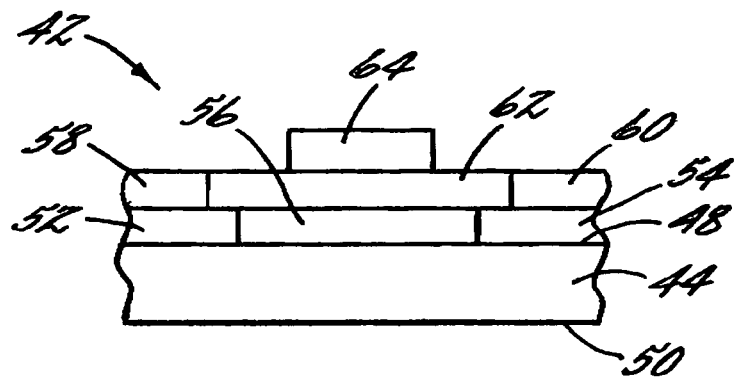
FIG. 5 is a schematic cross-sectional view of a metal oxide semiconductor field effect transistor in accordance with the present invention.

In another aspect, the invention is a plurality of metal oxide semiconductor field effect transistors (MOSFETs) 42 formed on low defect 3 inch silicon carbide substrate 44. FIG. 5 is a schematic cross-sectional illustration of a basic MOSFET structure. Each MOSFET 42 includes a bulk single crystal silicon carbide substrate wafer 44 of at least about 3 inches diameter and a 1 c screw dislocation density of less than 2500 $cm^{-2}$. The bulk single crystal substrate 44 includes a respective first surface 48 and second surface 50 opposite one another. An epitaxial layer on the substrate has respective source 52, channel 56, and drain 54 portions with the channel 56 being controlled by the gate contact 64 through the oxide layer 62. Respective source and drain contacts 58, 60 are on the source and drain portions 52, 54. The structure and operation of MOSFETs, and of combinations and variations of MOSFETs, is well understood in this art and thus FIG. 5 and its description are exemplary rather than limiting of the claimed invention.

Figure 6:
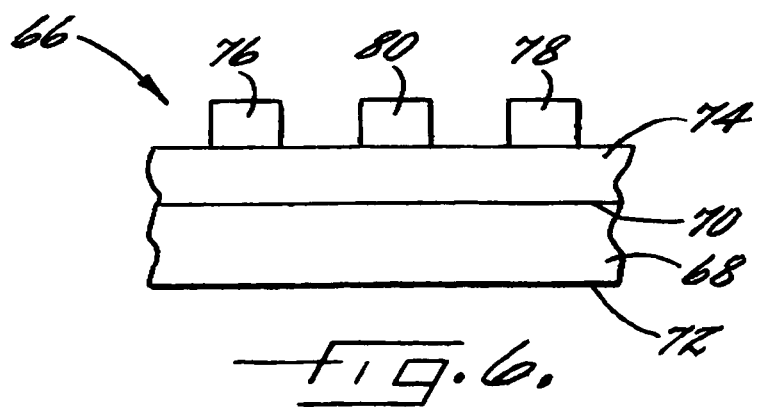
FIG. 6 is a schematic cross-sectional view of a metal semiconductor field effect transistor in accordance with the present invention.

With reference to FIG. 6, in another aspect the invention is a plurality of metal semiconductor field effect transistors (MESFETs) 66 formed on low defect 3 inch silicon carbide. Each MESFET 66 includes a bulk single crystal silicon carbide substrate wafer 68 of at least about 3 inches and having a 1 c screw dislocation density of less than 2500 $cm^{-2}$. The substrate 68 includes a respective first surface 70 and second surface 72 opposite one another. A conductive channel 74 is located on the first surface 70 of the substrate 68. Ohmic source 76 and a drain 78 contacts are located on the conductive channel 74. A metal gate contact 80 is located between the source 76 and drain 78 on the conductive channel 74 for forming an active channel when a bias is applied to the metal gate contact 80.

As is known in the art, more than one type of device may be situated on a silicon carbide wafer in accordance with the present invention. Additional devices that may be included are junction-field effect transistors, hetero field effect transistors, diodes, and other devices known in the art. The structure and operation of these (and other) devices are well-understood in this art and can be practiced using the substrates described and claimed herein without undue experimentation.

In the specification and the drawings, typical embodiments of the invention have been disclosed. Specific terms have been used only in a generic and descriptive sense, and not for purposes of limitation. The scope of the invention is set forth in the following claims.

The invention claimed is:

1. A method of forming a wafer of a high quality single crystal of SiC, the method comprising:

forming a SiC boule having a diameter of at least about 3 inches; and slicing a wafer having a 1 c screw dislocation density of less than about 2500 $cm^{-2}$ from said boule.

2. The method of claim 1, further comprising the step of polishing the wafer.

3. The method of claim 2, wherein the step of polishing the wafer comprises chemo-mechanical polishing.

4. The method of claim 1, wherein the step of forming a SiC boule comprises forming a boule having a 1 c screw dislocation density of less than about 2000 $cm^{-2}$.

5. The method of claim 1, wherein the step of forming a SiC boule comprises forming a boule having a 1 c screw dislocation density of less than about 1500 $cm^{-2}$.

6. The method of claim 1, wherein the step of forming a SiC boule comprises forming a boule having a 1 c screw dislocation density of less than about 1200 $cm^{-2}$.

7. In a method of producing a high quality bulk single crystal of silicon carbide in a seeded sublimation system, the improvement comprising:

growing a SiC boule having a diameter of at least about 3 inches and having a 1 c screw dislocation density of less than about 2000 $cm^{-2}$ on the surface; and slicing the SiC boule into wafers, wherein each wafer has a 1 c screw dislocation density of less than about 2000 cm$^{-2}$ on the surface.

8. A method according to claim 7 further comprising polishing the SiC wafers.

9. A method according to claim 8 further comprising:
attaching the polished SiC wafers to a seed holder;
placing the seed holder in a crucible;
placing SiC source powder in the crucible evacuating the crucible to remove ambient air and other impurities;
placing the crucible under inert gas pressure;
heating the system to SiC growth temperatures; and
reducing the pressure to initiate SiC growth.

10. A method according to claim 9 wherein the step of attaching the SiC seed to a seed holder comprises placing the seed on a graphite seed holder.

11. A method according to claim 9 wherein the step of placing a SiC seed on a seed holder in a crucible comprises placing the seed in a graphite crucible.

12. A method according to claim 9 further comprising stopping growth by raising the inert gas pressure in the crucible to above about 400 torr and lowering the temperature to below about 1900° C. to stop crystal growth.

13. A method according to claim 9 wherein the step of placing the crucible under inert gas pressure involves introducing an inert gas selected from the group consisting of noble gases, $N_2$, Ar, and mixtures thereof.

14. A method according to claim 9 wherein the step of heating the system to SiC growth temperatures involves heating to temperatures between about 1900 and 2500° C.

15. A method according to claim 9 further comprising the step of introducing dopant gases to the seeded sublimation system, thereby incorporating dopants into the SiC single crystal.

16. A method according to claim 9 further comprising annealing the crystal after the completion of the crystal growth process.

17. A method according to claim 9 wherein the step of attaching a SiC wafer to a seed holder comprises attaching a SiC seed having a 1 c screw density of less than about 1200 cm$^{-2}$.

18. A method according to claim 8 wherein the step of polishing the wafers comprises a chemo-mechanical polishing.

19. A method according to claim 8 further comprising etching the polished SiC wafers in molten KOH.

20. A method according to claim 7 wherein the step of slicing the SiC boule into wafers comprises a mechanical slice along a crystal growth axis.

21. A method according to claim 7 wherein the step of growing a SiC boule comprises a seeded sublimation growth of SiC.

22. A method according to claim 21 wherein said seeded sublimation growth of SiC comprises single polytype seeded sublimation growth.

23. A method according to claim 7 wherein the step of growing a SiC boule comprises growing a boule having a polytype selected from the group consisting of the 3C, 4H, 6H, and 15R polytypes.

24. A method according to claim 7 wherein the step of slicing the SiC boule into wafers comprises slicing the boules into wafers having a thickness of at about 0.5 mm.

25. A method of forming a wafer of a high quality single crystal of SiC, the method comprising:
forming a SiC boule having a diameter slightly larger than about 3 inches;
slicing the boule into wafers having a 1 c screw dislocation density of less than about 2500 cm$^{-2}$ on a surface of each wafer;
thereafter polishing the wafers;
etching the polished wafers in molten KOH; and
counting the 1 c screw dislocations on the surface of the etched wafers.

26. The method of claim 25 wherein the step of forming a SiC boule comprises forming a boule having a 1 c screw dislocation density of less than about 2000 cm$^{-2}$.

27. The method of claim 25 wherein the step of forming a SiC boule comprises forming a boule having a 1 c screw dislocation density of less than about 1500 cm$^{-2}$.

28. The method of claim 25 wherein the step of forming a SiC boule comprises forming a boule having a 1 c screw dislocation density of less than about 1200 cm$^{-2}$.

29. The method of claim 25 wherein the step of polishing the wafers comprises chemo-mechanical polishing.

30. The method of claim 25 wherein the step of etching the polished wafers in molten KOH comprises etching the wafers to a depth of greater than about 10 μm.

31. In a method of producing a high quality bulk single crystal of silicon carbide in a seeded sublimation system, the improvement comprising:
growing a SiC boule having a diameter of at least about 3 inches;
slicing a SiC wafer from said SiC boule;
polishing the SiC wafer;
introducing said polished SiC wafer into a crucible;
supplying a silicon carbide source material in said crucible; and
heating the crucible to sublimate the silicon carbide source material and to create a thermal gradient between the source material and the SiC wafer to encourage vapor phase movement of the source material to the polished SiC wafer and condensation of the source material on the SiC wafer to produce a single crystal of silicon carbide having a diameter of at least about 3 inches and a 1 c screw dislocation density of less than about 2500 cm$^{-2}$.

32. The method of claim 31, wherein the step of forming a single crystal of silicon carbide in said heating step comprises forming a single crystal of silicon carbide having a 1 c screw dislocation density of less than about 2000 cm$^{-2}$.

33. The method of claim 31, wherein the step of forming a single crystal of silicon carbide in said heating step comprises forming a single crystal of silicon carbide having a 1 c screw dislocation density of less than about 1500 cm$^{-2}$.

34. The method of claim 31, wherein the step of forming a single crystal of silicon carbide in said heating step comprises forming a single crystal of silicon carbide having a 1 c screw dislocation density of less than about 1200 cm$^{-2}$.

35. The method of claim 31, wherein the step of polishing the wafer comprises chemo-mechanical polishing.

* * * * *